United States Patent
Wu et al.

(10) Patent No.: US 8,956,972 B2
(45) Date of Patent: Feb. 17, 2015

(54) METHOD FOR MANUFACTURING SEMICONDUCTOR THICK METAL STRUCTURE

(71) Applicant: CSMC Technologies Fab1 Co., Ltd., Jiangsu (CN)

(72) Inventors: Hsiao-Chia Wu, Jiangsu (CN); Shilin Fang, Jiangsu (CN); Tse-Huang Lo, Jiangsu (CN); Zhengpei Chen, Jiangsu (CN); Shu Zhang, Jiangsu (CN)

(73) Assignee: CSMC Technologies Fab1 Co., Ltd., Jiangsu (CN)

( * ) Notice: Subject to any disclaimer, the term of this patent is extended or adjusted under 35 U.S.C. 154(b) by 0 days.

(21) Appl. No.: 14/351,828

(22) PCT Filed: Oct. 12, 2012

(86) PCT No.: PCT/CN2012/082838
§ 371 (c)(1),
(2) Date: Apr. 14, 2014

(87) PCT Pub. No.: WO2013/064009
PCT Pub. Date: May 10, 2013

(65) Prior Publication Data
US 2014/0329385 A1 Nov. 6, 2014

(30) Foreign Application Priority Data
Oct. 14, 2011 (CN) .......................... 2011 1 0311498

(51) Int. Cl.
*H01L 21/44* (2006.01)
*H01L 21/768* (2006.01)

(52) U.S. Cl.
CPC .................................. *H01L 21/7685* (2013.01)
USPC ...................... 438/656; 438/72; 257/E21.029

(58) Field of Classification Search
USPC .................................................. 257/E21.234
See application file for complete search history.

(56) References Cited

U.S. PATENT DOCUMENTS 6,268,274 B1    7/2001    Wang et al.

FOREIGN PATENT DOCUMENTS

| CN | 101981672 A | 2/2011 |
| CN | 102154650 A | 8/2011 |

*Primary Examiner* — Cheung Lee
(74) *Attorney, Agent, or Firm* — Muncy, Geissler, Olds & Lowe, P.C.

(57) ABSTRACT

A method for manufacturing a semiconductor thick metal structure includes a thick metal deposition step, a metal patterning step, and a passivation step. In the thick metal deposition step, a Ti—TiN laminated structure is used as an anti-reflection layer to implement 4 μm metal etching without residue. In the metal patterning step, $N_2$ is used for the protection of a sidewall to implement on a 4 μm metal concave-convex structure a tilt angle of nearly 90 degrees, and a main over-etching step is added to implement the smoothness of the sidewall of the 4 μm metal concave-convex structure. A half-filled passivation filling structure is used to implement effective passivation protection of 1.5 um metal gaps having less than 4 um of metal thickness. Manufacturing of the 4 μm thick metal structure having a linewidth/gap of 1.5 μm/1.5 μm is finally implemented.

15 Claims, 4 Drawing Sheets

METHOD FOR MANUFACTURING SEMICONDUCTOR THICK METAL STRUCTURE

FIELD OF THE INVENTION

The present disclosure relates to methods of manufacturing an integrated circuit, and more particularly relates to a method of manufacturing of a thick metal with a small linewidth.

BACKGROUND OF THE INVENTION

Bonding pad is a component used to connect the internal elements of the chip to the external. Normally, the bonding pad is fabricated on the outermost layer of the chip. The bonding pad is made of conductive metal such as aluminum and copper, and it occupies 5% to 20% area of the chip die. With the continuous development of the integrated circuit, in the process under 0.5 μm, in order to effectively use the area of bonding pad and decrease the on-state of the power MOS transistor on-resistance (RDSon), the elements are needed to be placed under the bonding pad, i.e., CUP (Circuit Under Pad).

However, a problem encountered by the CUP process is that, during the packaging process, the bonding pad is subjected to great stress during the bonding process to the wires. In order to prevent the stress of wire bonding from affecting the performance of the chip, a plurality of metal layers or a single metal layer with 4 μm thickness is employed to release the stress.

As respecting to the CUP process using a plurality of metal layers, the disadvantage is that, each additional layer of metal will lead to an additional fabrication of through-hole and two layers of metal pattern, thus resulting an increase of cost by 20 to 40 dollars each IC wafer, which greatly reduce the competitiveness of IC.

In the 4 μm thick layer metal layer CUP production process, since modern semiconductor process requires the metal width to be continually decreased, the problem encountered by the production of thick metal layer is that, first, when the metal linewidth is less than 2 μm, $Al_2O_3$ residue is easily generated during the fabrication of Al—Cu metal structure with a thickness of 4 μm. In order to reduce the residue, deep etching is needed during the metal etching process, which requires that the photoresist for etching has a certain thickness. However, if the photoresist is too thick, after the exposure, it is impossible to obtain narrow etching width due to the resolution and other reasons, which forms a contradictory with narrow linewidth metal etching. Second, when the metallization process is completed, it is required to form a passivation layer on the surface of the metal layer. As for the metal strips dense area with narrow linewidth and deep depth, a key hole is easily formed at the gap between two metal strips during the production of the passivation layer. The key hole allows for retaining of the photoresist during the removing of the photoresist when etching the passivation layer, and the photoresist will expand during the subsequent alloy process, thus forming surface defects, such as photoresist residues 11 labeled in FIG. 1. In order to prevent the formation of the key hole, plasma enhanced chemical vapor deposition (PECVD) and high density plasma deposition (HDP) methods are often used to fully fill the metal condense area with the passivation layer. However, in this way, the increasing metal thickness will lead to an increasing passivation thickness and an increasing etching thickness, meanwhile, the deposition rate of HDP process is low, which leads to a longer deposition time and etching time and a higher cost.

The above reasons will increase the difficulty level of the thick metal structure during the conventional semiconductor process, it is thus necessary to make improvements to the conventional semiconductor process to overcome the above problems.

SUMMARY OF THE INVENTION

In view of this, the present invention proposes a method of manufacturing a semiconductor thick metal structure. When manufacturing a single metal layer with a linewidth of 1.5 μm to 2 μm, a thickness above 4 μm, the method can avoid the oxide residue generated in metal etching without using thick photoresist. During the passivation process of the metal surface, the half-full passivation process can ensure the protection of the passivation layer and reduce the time of the passivation process.

According to the object, a method of manufacturing of a semiconductor thick metal structure is provided, which includes:

a thick metal deposition step comprising: depositing a barrier layer, a metal layer, and an anti-reflection layer on a surface of a semiconductor chip, wherein the metal layer has a thickness of 3.5 μm to 4.5 μm; the anti-reflection layer comprises a titanium layer and a titanium nitride layer;

a metal patterning step comprising: coating a photoresist layer on the anti-reflection layer; exposing the photoresist layer using a mask, such that partial photoresist corresponding to patterns of the mask becomes soluble; etching and removing the soluble photoresist; etching the metal layer using a four-step etching method with the remaining photoresist as a mask to form a surface pattern having a concavo-convex structure with a feature size of 1.5 μm to 2 μm; and a passivation step comprising: forming a passivation layer on a surface of the metal layer having the concavo-convex structure, wherein the passivation layer is half-full filled in the concavo-convex structure of the metal layer. Optionally, the thick metal deposition step comprises:

forming the barrier layer on the surface of the chip, the barrier layer comprises a titanium layer and a titanium nitride layer, wherein the titanium layer has a thickness of 300 Å to 600 Å, the titanium nitride layer has a thickness of 300 Å to 800 Å;

forming the metal layer on the barrier layer, wherein the metal layer comprises a aluminum-copper layer and an Al—Si—Cu layer;

forming the anti-reflection layer on the metal layer, wherein the anti-reflection layer comprises the titanium layer and the titanium nitride layer, the titanium layer has a thickness of 100 Å to 400 Å, and the titanium nitride layer has a thickness of 250 Å to 400 Å.

Optionally, the barrier layer is formed using a physical vapor deposition process with the following parameters: a temperature is 300° C. to 400° C.; a power of forming the titanium layer is 2500 W to 4000 W; an Ar flow is 30 SCCM to 80 SCCM, the time is controlled to be 15 s to 30 s; a power of forming the titanium nitride layer is 7000 W to 10000 W; an Ar flow is 20 SCCM to 45 SCCM; a $N_2$ flow is 80 SCCM to 135 SCCM; a time is 15 s to 25 s.

Optionally, the metal layer is formed using a physical vapor deposition process with the following parameters: a deposition temperature is 300° C. to 400° C.; a power is 8000 W to 14000 W; an Ar flow is 30 SCCM to 80 SCCM; a time is 150 s to 300 s.

Optionally, the anti-reflection layer is formed using a physical vapor deposition process with the following parameters: a temperature is 300° C. to 400° C.; a power of forming the titanium layer is 2500 W to 4000 W; an Ar flow is 30 SCCM to 80 SCCM, the time is controlled to be 10 s to 20 s; a power of forming the titanium nitride layer is 7000 W to 10000 W; an Ar flow is 20 SCCM to 45 SCCM; a $N_2$ flow is 80 SCCM to 135 SCCM; a time is 10 s to 15 s.

Optionally, the four-step etching method comprises:

performing physical bombardment to the surface using Ar to remove residual photoresist on a surface of the metal region to be etched;

a main etching step comprising: etching the metal layer using boron trichloride gas and chlorine by an automatically-grabbing-end method, wherein an etching rate of the metal layer and an etching rate of the photoresist are determined by a ratio of the boron trichloride gas to the chlorine, such that a final effective residual thickness of the photoresist is greater than 4000 Å, and a protection of a sidewall of the concavo-convex structure of the metal layer is enhanced by nitrogen;

a main over-etching step comprising: performing an over-etching step with the same parameters as the main etching step, wherein a time for over-etching is to 50 s; and a subsidiary over-etching step, wherein a time of the subsidiary over-etching step is less than 100 s, and a ratio of the chlorine to the boron trichloride gas is 1 to 1.5.

Optionally, parameters of the physical bombardment step using Ar comprises: an Ar flow is 40 SCCM to 80 SCCM, a pressure is 8 mT to 15 mT, a time is 20 s to 40 s; a power is 600 W to 1000 W.

Optionally, parameters of the main etching step comprises: a temperature is 40° C. to 70° C., a boron trichloride flow is 50 SCCM to 80 SCCM, a chlorine gas flow is 80 SCCM to 120 SCCM, a nitrogen flow is 5 SCCM to 30 SCCM, a pressure is 10 mT to 16 mT, a power is 600 W to 1000 W.

Optionally, the passivation step comprises:

depositing a silicon-rich oxide layer having a thickness of 50 nm to 200 nm on a surface of the metal layer having the concavo-convex structure;

depositing a high density plasma silicon dioxide layer having a thickness of 1000 nm to 1500 nm on a surface of the silicon-rich oxide layer using a high-density plasma deposition process; and depositing a silicon nitride layer having a thickness of 500 nm to 800 nm on the high density plasma silicon dioxide layer.

Optionally, parameters of the step of depositing the silicon-rich oxide layer comprises: a temperature is 350° C. to 450° C., a $N_2O$ flow is 200 SCCM to 350 SCCM, a $SiH_4$ flow is 70 SCCM to 120 SCCM, a power is 150 W to 250 W, a time is 5 s to 20 s.

Optionally, parameters of the step of depositing the high density plasma silicon dioxide layer comprises: a temperature is 350° C. to 450° C., a $SiH_4$ flow is 50 SCCM to 150 SCCM, an $O_2$ flow is 50 SCCM to 200 SCCM, an Ar flow is 300 SCCM to 450 SCCM, a power is 2000 W to 4000 W, a time is 100 s to 200 s.

Optionally, parameters of the step of depositing the silicon nitride layer comprises: a temperature is 350° C. to 450° C., a $SiH_4$ flow is 500 SCCM to 800 SCCM, an $N_2$ flow is 7000 SCCM to 9000 SCCM, an $NH_3$ flow is 250 SCCM to 400 SCCM, a power is 500 W to 900 W, a time is 40 s to 60 s.

Optionally, during the step of thick metal deposition, the depositions of the barrier layer, the metal layer, and the anti-reflection layer are performed in one machine.

Optionally, the photoresist layer has a thickness of 3 μm to 3.5 μm.

Optionally, after the passivation step, a bonding pad window is fabricated by a photolithography/etching process.

Under the existing process with no further layers or steps, 1.5 μm/1.5 μm metal process under a thickness of 4 μm is produced by the present invention. When applying to CUP circuit design, it can increase available chip area by 5% to 20%, thus greatly reducing the cost of the chip.

In the present invention, a passivation layer which is thinner than that in the prior art is achieve the half-full filling, thus a high-quality passivation can be obtained with shorter consuming time and lower cost.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION OF THE EMBODIMENTS

Figure 1:
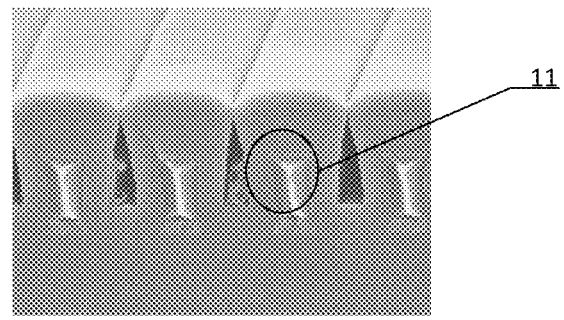
FIG. 1 shows a photoresist residue located in a gap of a passivation layer according to the prior art.

As described in the background of the invention, during the manufacture of the metal structure having a thickness greater than 4 μm, a linewidth less than 2 μm using the conventional semiconductor techniques, it is easy to form the metal oxide residues during the metal etching process, such that the manufacturing difficulty is increased. On the other hand, when fabricating the passivation layer on the metal surface, as regarding to the metal structure having a larger depth-to-width ratio, the thickness of the passivation layer to be deposited is also great, such that a longer deposition time is needed, thus affecting the efficiency.

To solve the above-mentioned problems, the present invention provides a method of manufacturing of a semiconductor thick metal structure, which includes a thick metal deposition step, a metal patterning step, and a passivation step.

The thick metal deposition step includes: depositing a barrier layer, a metal layer, and an anti-reflection layer on a surface of a semiconductor chip subsequently. The depositions of the barrier layer, the metal layer, and the anti-reflection layer are performed in one machine. The metal layer has a thickness of 3.5 μm to 4.5 μm. The anti-reflection layer includes a titanium layer and a titanium nitride layer.

The metal patterning step includes a photoresist etching process and a metal etching process. The photoresist etching process includes: coating a photoresist layer with a thickness of 3 μm to 3.5 μm on the anti-reflection layer; exposing the photoresist layer using a mask, such that partial photoresist corresponding to patterns of the mask becomes soluble; etching and removing the soluble photoresist; etching the metal layer using a four-step etching method with the remaining photoresist as a mask to form a surface pattern having a concavo-convex structure with a feature size of 1.5 μm to 2 μm.

The passivation process includes fabricating three passivation layers on the metal layer having the concavo-convex structure, and the three passivation layers are half-full filled in the concavo-convex structure of the metal layer.

Improvement to the conventional semiconductor processes can optimize the production of thick metal structure, so that the metal oxide residue generated during the production of the thick metal structure can be avoided. Therefore, the lithography process can be achieved using a relatively thin photoresist, and the production of thick metal structure can be possible. In addition, a passivation process is provided to form a half-full passivation layer on the thick metal structure, which not only can protect the metal layer, but also can reduce the production time, thus greatly increasing the production efficiency.

Since titanium is added into the anti-reflection layer, the thick metal grain gap can be effectively filled, so as to prevent the metal gap from be oxidized into $Al_2O_3$, the problem of $Al_2O_3$ residue after etching the single-layered thin TiN anti-reflection layer in the thick metal process can be solved. And the lithography process under the narrow linewidth and thin photoresist layer can be achieved.

Via the half-full passivation filling, a high-quality passive protection can be achieved, which is shorter than the conventional time-consuming full filling and is less costly.

Specific embodiments of the present invention will be further described in details.

Firstly, a thick metal deposition process is performed on a surface of a chip which is pretreated. The so-called "pretreated" means the lower structure of the chip has already been fabricated by the diffusion/injection/lithography/etching method, and the surface of the chip has been flatten by a chemical mechanical polishing (CMP) process, and a top through hole has been fabricated using CMP W-plug process to form a conductive plug. These processes mentioned above are known in the art, therefore, they will not further described in the present invention.

Figure 2:
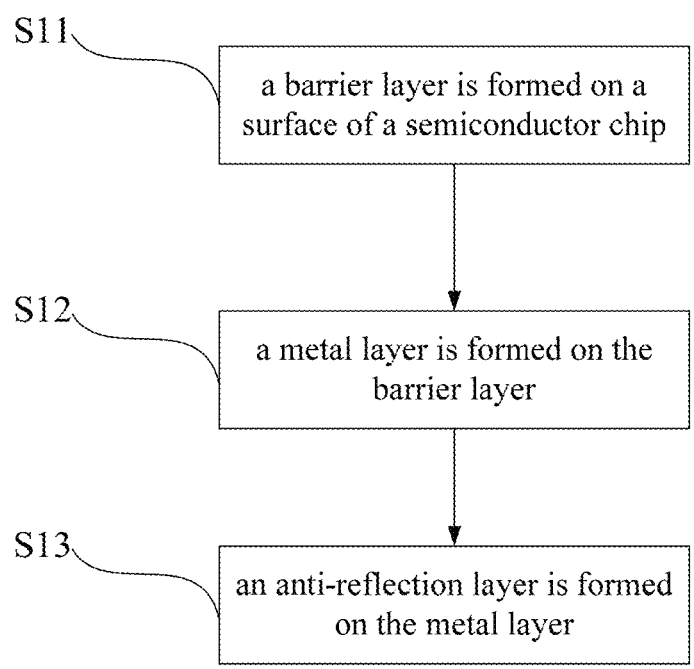
FIG. 2 is a flow chart of a method of manufacturing of a semiconductor thick metal structure according to the present invention.

FIG. 2 is a flow chart of a method of manufacturing of a semiconductor thick metal structure according to the present invention. As shown in FIG. 2, the method includes the following steps:

Step S11, a barrier layer is initially formed on a surface of a semiconductor chip. The barrier layer has two functions, firstly it can enhance the bonding between the metal and the lower film, and secondly it can be used to control the etching time during the subsequent etching process. The barrier layer includes a titanium layer and a titanium nitride layer. The titanium layer has a thickness of 300 Å to 600 Å, and the titanium nitride layer has a thickness of 300 Å to 800 Å.

Specifically, the barrier layer is formed using a physical deposition production process with the following parameters: a temperature is 300° C. to 400° C.; a power of forming the titanium layer is 2500 W to 4000 W; an Ar flow is 30 SCCM to 80 SCCM, the time is controlled to be 15 s to 30 s; a power of forming the titanium nitride layer is 7000 W to 10000 W; an Ar flow is 20 SCCM to 45 SCCM; a $N_2$ flow is 80 SCCM to 135 SCCM; a time is 15 s to 25 s.

Step S12, a metal layer is formed on the barrier layer, the metal layer includes a aluminum-copper layer and an Al—Si—Cu layer having a thickness of 3.5 μm to 4.5 μm.

The metal layer and the barrier layer are formed in the same deposition machine. Specifically, the parameters of forming the metal layer are: a deposition temperature is 300° C. to 400° C.; a power is 8000 W to 14000 W; an Ar flow is 30 SCCM to 80 SCCM; a time is 150 s to 300 s.

Figure 3A:
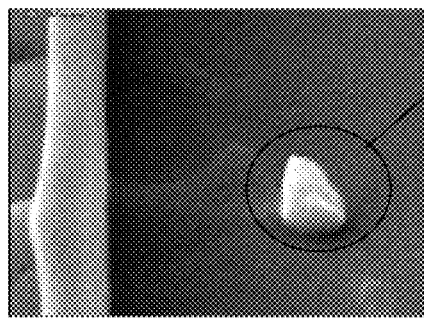
FIGS. 3A and 3B are pictures taken by an electron microscope showing the metal structures manufactured according to the present invention and the prior art.
Figure 3B:
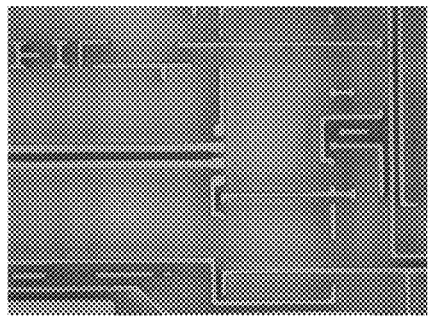

Step S13, an anti-reflection layer is formed on the metal layer. The titanium layer has a thickness of 100 Å to 400 Å, and the titanium nitride layer has a thickness of 250 Å to 400 Å. The adding of titanium can fill the thick metal grain gap effectively, so as to prevent the metal gap from being oxidized into $Al_2O_3$, thus the problem of $Al_2O_3$ residue after etching the single-layered thin TiN anti-reflection layer in the thick metal process can be solved. FIG. 3 is a picture showing the metal structures before and after the present manufacturing method. As can be seen from FIG. 3A, in the metal structure manufactured according to the prior art, there is an $Al_2O_3$ 31 residue. However, in FIG. 3B, there is no residue in the metal structure manufactured according to the present method.

The lithographic linewidth can be effectively controlled by the TiN layer. The Ti—TiN anti-reflection layer is deposited in a chamber with the same deposition parameters as that of the barrier layer, and the thickness is determined by adjusting time. Specifically, a temperature is 300° C. to 400° C.; a power of forming the titanium layer is 2500 W to 4000 W; an Ar flow is 30 SCCM to 80 SCCM, the time is controlled to be 15 s to 30 s; a power of forming the titanium nitride layer is 7000 W to 10000 W; an Ar flow is 20 SCCM to 45 SCCM; a $N_2$ flow is 80 SCCM to 135 SCCM; a time is 15 s to 25 s.

After the deposition of the thick metal, the surface of the metal layer can be patterned. The purpose of the patterning is to form a pattern structure on the metal layer. The patterning process includes a photoresist etching process and a metal etching process. A photoresist layer is coated on a surface of the anti-reflection layer. Since the feature size of the metal structure is less than 2 μm, the thickness of the coated photoresist layer should not be too large; otherwise the etching precision will be affected. In the present invention, the thickness of the photoresist layer is of 3 μm to 3.5 μm.

After the coating of the photoresist, it will be exposed. The photoresist is exposed using a mask, such that part of the photoresist corresponding to patterns of the mask becomes soluble. The soluble photoresist is then removed by etching, therefore the desired pattern will be appeared on the photoresist layer. The metal layer is etched using the remaining photoresist as a mask, such that the pattern on the photoresist is transferred to the metal, thus forming the metal structure. The specific embodiment of the metal etching process is a four-step etching process.

Figure 4:
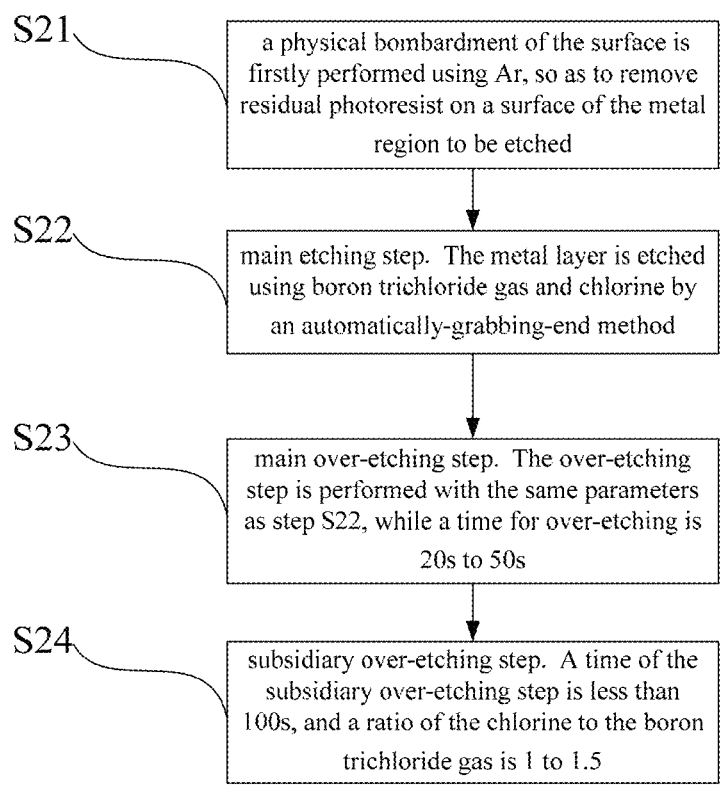
FIG. 4 is a flow chart of a metal etching process according to the present invention.

FIG. 4 is a flow chart of a metal etching process according to the present invention. As can be seen, the four-step etching process used in the metal etching process includes the following steps:

Step S21, a physical bombardment to the surface is firstly performed using Ar, so as to remove residual photoresist on a surface of the metal region to be etched and do the preparation for the subsequent etching.

The specific parameters are: an Ar flow is 40 SCCM to 80 SCCM, a pressure is 8 mT to 15 mT, a time is 20 s to 40 s; a power is 600 W to 1000 W.

Step S22, the second step is a main etching step. The metal layer is etched using boron trichloride gas and chlorine by an automatically-grabbing-end method. The so-called automatically-grabbing-end method means using the barrier layer beneath the metal layer as an end, when the barrier layer is exposed, then etching is stopped. The etching rate of the metal layer and an etching rate of the photoresist are determined by a ratio of the boron trichloride gas to the chlorine, and the final effective residual photoresist thickness is greater than 4000 Å. A protection of a sidewall of the concavo-convex structure of the metal layer is enhanced by nitrogen, thus ensuring an inclination angle of the concavo-convex structure is nearly 90 degrees. After the main etching step, the appearance of the metal layer patterning structure is formed. Since the consuming time of the main etching step is longest and the loss amount of the photoresist is greatest, the etching rate of the photoresist is therefore needed to be carefully controlled.

Specifically, the parameters of the main etching are: a temperature is 40° C. to 70° C., a boron trichloride flow is 50 SCCM to 80 SCCM, a chlorine gas flow is 80 SCCM to 120 SCCM, a nitrogen flow is 5 SCCM to 30 SCCM, a pressure is 10 mT to 16 mT, a power is 600 W to 1000 W.

Step S23, the third step is a main over-etching step. The over-etching step is performed with the same parameters as step S22, while a time for over-etching is 20 s to 50 s. As an additional step compared with the conventional three-step etching process, the third step can solve the problem of micro-loading effect, which can result holes on the metal sidewall during the transition from main etching to over-etching, such that a smooth sidewall of the metal strip of thick metal etching process-intensive areas can be successfully implemented.

Step S24, the fourth step is a subsidiary over-etching step. A time of the subsidiary over-etching step is less than 100 s, and a ratio of the chlorine to the boron trichloride gas is 1 to 1.5, which can ensure the needed area is completely etched.

Figure 5A:
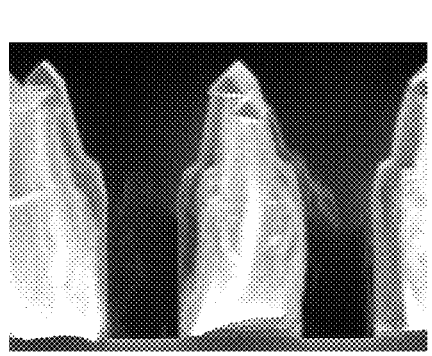
FIGS. 5A and 5B are pictures taken by an electron microscope showing the appearance of the metal structures etched according to the present invention and the prior art.
Figure 5B:
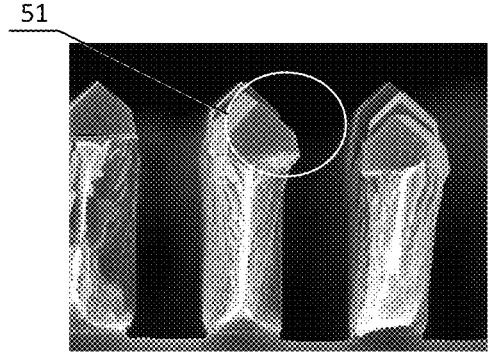

Referring to FIG. 5, in FIG. 5A, after the etching according to the prior art, there is hardly any photoresist left, and the morphology of the side wall of the metal strips is poor. In FIG. 5B, upon using four-step etching process according to the present invention, the remaining thickness of the photoresist 51 is more than 4000 Å, and the inclination angle of the metal strip is close to 90 degrees.

After the etching of metal is completed, a concavo-convex structure of the metal layer is formed. After that, a passivation layer is needed to be formed on the surface of the metal layer to prevent contamination. In the conventional passivation process, in order to remove the key hole generated in the metal groove, a full-filling method is employed, i.e., the metal groove is fully filled with passivation layer. However, the full-filling method is time-consuming and has slow efficiency. Therefore, in the present invention, a half full filling method is employed to performed the passivation process on the metal surface.

Figure 6:
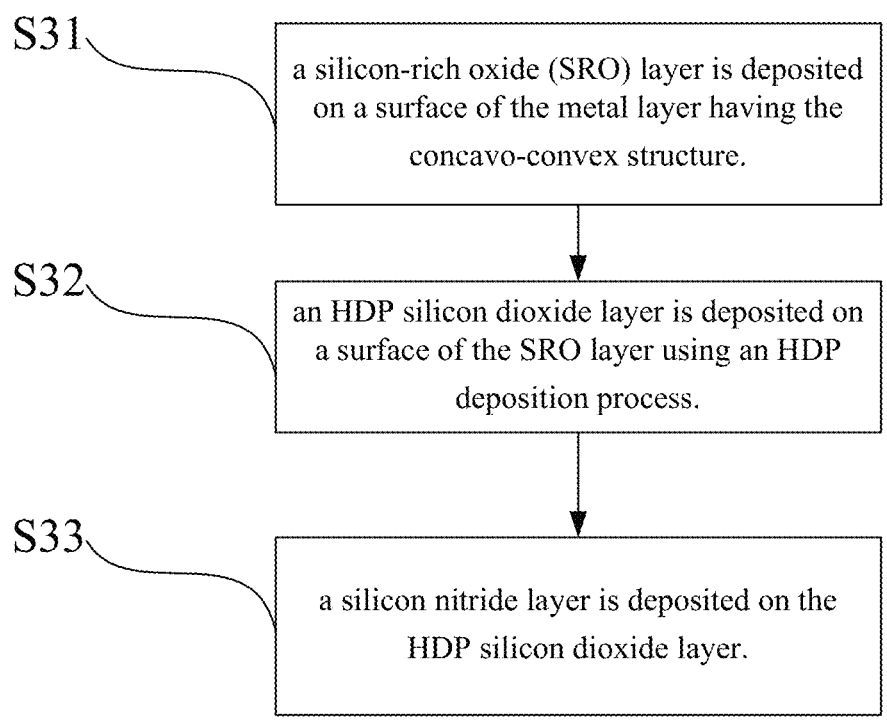
FIG. 6 is a flow chart of a passivation process according to the present invention.

FIG. 6 is a flow chart of a passivation process according to the present invention. The passivation process includes the following steps:

Step S31, a silicon-rich oxide (SRO) layer is deposited on a surface of the metal layer having the concavo-convex structure. The SRO layer has a thickness of 50 nm to 200 nm and is used as a protection layer of the metal layer, thus preventing the damage to the metal strip from subsequent high density plasma deposition (HDP) process.

The specific parameters for the production process of SRO layer are: using C2 Sequel machine, the temperature is controlled at 350° C. to 450° C., $N_2O$ flow is 200 SCCM of to 350 SCCM, $SiH_4$ flow rate is 70 SCCM to 120 SCCM, a power is 150 W to 250 W, a time is 5 s to 20 s.

Step S32, an HDP silicon dioxide layer is deposited on a surface of the SRO layer using an HDP deposition process. The HDP silicon dioxide layer has a thickness of 1000 nm to 1500 nm. Since the filling effect of the narrow linewidth of the HDP silicon dioxide layer is good, the HDP silicon dioxide layer can be used as a main filling layer of the passivation layer.

The specific parameters for the production process of the HDP layer are: a temperature is 350° C. to 450° C., a $SiH_4$ flow is 50 SCCM to 150 SCCM, an $O_2$ flow is 50 SCCM to 200 SCCM, an Ar flow is 300 SCCM to 450 SCCM, a power is 2000 W to 4000 W, a time is 100 s to 200 s.

Step S33, a silicon nitride layer is deposited on the HDP silicon dioxide layer. The silicon nitride layer has a thickness of 500 nm to 800 nm. The silicon nitride layer is used to provide a passivation protection to the metal surface.

The specific parameters for the production process of the silicon nitride layer are: a temperature is 350° C. to 450° C., a $SiH_4$ flow is 500 SCCM to 800 SCCM, an $N_2$ flow is 7000 SCCM to 9000 SCCM, an $NH_3$ flow is 250 SCCM to 400 SCCM, a power is 500 W to 900 W, a time is 40 s to 60 s.

Compared with the conventional full filling method, the half-full filling of the passivation layer in the minimum gap is achieved, such that the problem of photoresist residue due to the key hole is solved, and the higher efficiency and lower cost are obtained. It should be noted that, besides the above-described combination of the passivation layer structure, other commonly used layers combination can be used, such as PETEOS layer, SAUSG layer, SOG layer, SION layer, etc.

Figure 7:
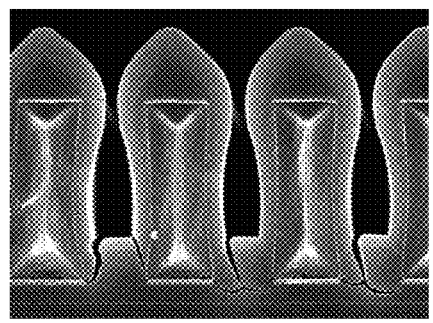
FIG. 7 is a picture taken by an electron microscope showing the passivation layer according to the present invention.

Finally, after the passivation process, a bonding pad window is fabricated by a photolithography/etching process, which is used for bonding and chip test leads. As can be seen from FIG. 7, the metal passivation layer obtained by the optimized process the present invention has a normal morphology of the sidewall, and the passivation layer is half-full filled.

The performance evaluation data of the thick metal structure produced by the method of the present invention are shown below:

Metal stress migration (SM) test: the test standard is to test the resistance changes of the metal after curing in the oven for 1000 hours at 125° C., if the change is less than 10%, then it passes. The actual test result shows the resistance decreased by 4.97%, which meets the requirements.

The metal electrical migration (EM) change test: the test standard is test the resistance changes of the metal after curing in the oven for 300 hours at 250° C. and 60 mA/μm, so as to estimate life having 0.1% resistance change under conditions of 125° C. and 7 mA/μm. If the life is longer the 10 years, then it passes. The actual test results for the life is more than 30 years, which meets the requirements.

Passivation complete reliability test: the test standard is to determine whether pinhole defect occurs after being immersed in an Al etching solution for 100 minutes under the conditions of 25° C., where the Al etching solution is composed of $HNO_3$ (70%):$H_3PO_4$ (85%):Acetic Acid:De-ionized Water=5:80:5:10. The actual test result shows there is zero pinhole defect, which meets the requirements.

Wire bonding test: the test standard is if the solder balls failure rate is less than 0.4% at a tension greater than 10 grams, then it passes. The actual test result shows the failure rate is 0.17%, which meets the requirements.

In summary, the present invention has the following improvements:

1. In the thick metal deposition process, the Ti—NiN lamination structure is used as the anti-reflection layer, such that 4 μm metal etching is performed with no residue.

2. In the metal etching process, since $N_2$ is used to protect the sidewall, the inclination angle of the 4 μm metal strip is close to 90 degrees.

3. In the metal etching process, a main etch-over step is employed, such that the sidewall of 4 μm metal strip is smooth.

4. The half-full passivation filled structure is used, such that the gap of 1.5 μm metal of the 4 μm thickness of metal is effectively protected by the passivation.

The technical effect achieved by the present invention is as follows:

Under the existing process with no further layers or steps, 1.5 μm/1.5 μm metal process under a thickness of 4 μm is produced. When applying to CUP circuit design, it can increase available chip area by 5% to 20%, thus greatly reducing the cost of the chip.

In the present invention, a passivation layer which is thinner than that in the prior art is achieve the half-full filling, thus a high-quality passivation can be obtained with shorter consuming time and lower cost.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing of a semiconductor thick metal structure, comprising:
   a thick metal deposition step comprising: depositing a barrier layer, a metal layer, and an anti-reflection layer on a surface of a semiconductor chip, wherein the metal layer has a thickness of 3.5 μm to 4.5 μm; the anti-reflection layer comprises a titanium layer and a titanium nitride layer;
   a metal patterning step comprising: coating a photoresist layer on the anti-reflection layer;
   exposing the photoresist layer using a mask, such that partial photoresist corresponding to patterns of the mask becomes soluble; etching and removing the soluble photoresist;
   etching the metal layer using a four-step etching method with the remaining photoresist as a mask to form a surface pattern having a concavo-convex structure with a feature size of 1.5 μm to 2 μm; and
   a passivation step comprising: forming a passivation layer on a surface of the metal layer having the concavo-convex structure, wherein the passivation layer is half-full filled in the concavo-convex structure of the metal layer.

2. The method according to claim 1, wherein the thick metal deposition step comprises:
   forming the barrier layer on the surface of the chip, wherein the barrier layer comprises a titanium layer and a titanium nitride layer, the titanium layer has a thickness of 300 Å to 600 Å, the titanium nitride layer has a thickness of 300 Å to 800 Å;
   forming the metal layer on the barrier layer, wherein the metal layer comprises an aluminum-copper layer and an Al—Si—Cu layer; and
   forming the anti-reflection layer on the metal layer, wherein the anti-reflection layer comprises the titanium layer and the titanium nitride layer, the titanium layer has a thickness of 100 Å to 400 Å, and the titanium nitride layer has a thickness of 250 Å to 400 Å.

3. The method according to claim 2, wherein the barrier layer is formed using a physical vapor deposition process with the following parameters: a temperature is 300° C. to 400° C.; a power of forming the titanium layer is 2500 W to 4000 W; an Ar flow is 30 SCCM to 80 SCCM, the time is controlled to be 15 s to 30 s; a power of forming the titanium nitride layer is 7000 W to 10000 W; an Ar flow is 20 SCCM to 45 SCCM; a $N_2$ flow is 80 SCCM to 135 SCCM; a time is 15 s to 25 s.

4. The method according to claim 2, wherein the metal layer is formed using a physical vapor deposition process with the following parameters: a deposition temperature is 300° C. to 400° C.; a power is 8000 W to 14000 W; an Ar flow is 30 SCCM to 80 SCCM; a time is 150 s to 300 s.

5. The method according to claim 2, wherein the anti-reflection layer is formed using a physical vapor deposition process with the following parameters: a temperature is 300° C. to 400° C.; a power of forming the titanium layer is 2500 W to 4000 W; an Ar flow is 30 SCCM to 80 SCCM, the time is controlled to be 10 s to 20 s; a power of forming the titanium nitride layer is 7000 W to 10000 W; an Ar flow is 20 SCCM to 45 SCCM; a $N_2$ flow is 80 SCCM to 135 SCCM; a time is 10 s to 15 s.

6. The method according to claim 1, wherein the four-step etching method comprises:
   performing physical bombardment to the surface using Ar to remove residual photoresist on a surface of the metal region to be etched;
   a main etching step comprising: etching the metal layer using boron trichloride gas and chlorine by an automatically-grabbing-end method, wherein an etching rate of the metal layer and an etching rate of the photoresist are determined by a ratio of the boron trichloride gas to the chlorine, such that a final effective residual thickness of the photoresist is greater than 4000 Å, and a protection of a sidewall of the concavo-convex structure of the metal layer is enhanced by nitrogen;
   a main over-etching step comprising: performing an over-etching step with the same parameters as the main etching step, wherein a time for over-etching is 20 s to 50 s; and
   a subsidiary over-etching step, wherein a time of the subsidiary over-etching step is less than 100 s, and a ratio of the chlorine to the boron trichloride gas is 1 to 1.5.

7. The method according to claim 6, wherein parameters of the physical bombardment step using Ar comprises: an Ar flow is 40 SCCM to 80 SCCM, a pressure is 8 mT to 15 mT, a time is 20 s to 40 s; a power is 600 W to 1000 W.

8. The method according to claim 6, wherein parameters of the main etching step comprises: a temperature is 40° C. to 70° C., a boron trichloride flow is 50 SCCM to 80 SCCM, a chlorine gas flow is 80 SCCM to 120 SCCM, a nitrogen flow is 5 SCCM to 30 SCCM, a pressure is 10 mT to 16 mT, a power is 600 W to 1000 W.

9. The method according to claim 6, wherein the passivation step comprises:
   depositing a silicon-rich oxide layer having a thickness of 50 nm to 200 nm on a surface of the metal layer having the concavo-convex structure;
   depositing a high density plasma silicon dioxide layer having a thickness of 1000 nm to 1500 nm on a surface of the silicon-rich oxide layer using a high-density plasma deposition process; and
   depositing a silicon nitride layer having a thickness of 500 nm to 800 nm on the high density plasma silicon dioxide layer.

10. The method according to claim 9, wherein parameters of the step of depositing the silicon-rich oxide layer comprises: a temperature is 350° C. to 450° C., a $N_2O$ flow is 200 SCCM to 350 SCCM, a $SiH_4$ flow is 70 SCCM to 120 SCCM, a power is 150 W to 250 W, a time is 5 s to 20 s.

11. The method according to claim 9, wherein parameters of the step of depositing the high density plasma silicon dioxide layer comprises: a temperature is 350° C. to 450° C., a $SiH_4$ flow is 50 SCCM to 150 SCCM, an $O_2$ flow is 50 SCCM to 200 SCCM, an Ar flow is 300 SCCM to 450 SCCM, a power is 2000 W to 4000 W, a time is 100 s to 200 s.

12. The method according to claim 9, wherein parameters of the step of depositing the silicon nitride layer comprises: a temperature is 350° C. to 450° C., a $SiH_4$ flow is 500 SCCM to 800 SCCM, an $N_2$ flow is 7000 SCCM to 9000 SCCM, an $NH_3$ flow is 250 SCCM to 400 SCCM, a power is 500 W to 900 W, a time is 40 s to 60 s.

13. The method according to claim 1, wherein during the step of thick metal deposition, the depositions of the barrier layer, the metal layer, and the anti-reflection layer are performed in one machine.

14. The method according to claim 1, wherein the photoresist layer has a thickness of 3 μm to 3.5 μm.

15. The method according to claim 1, wherein after the passivation step, a bonding pad window is fabricated by a photolithography/etching process.

* * * * *